Figure 1:
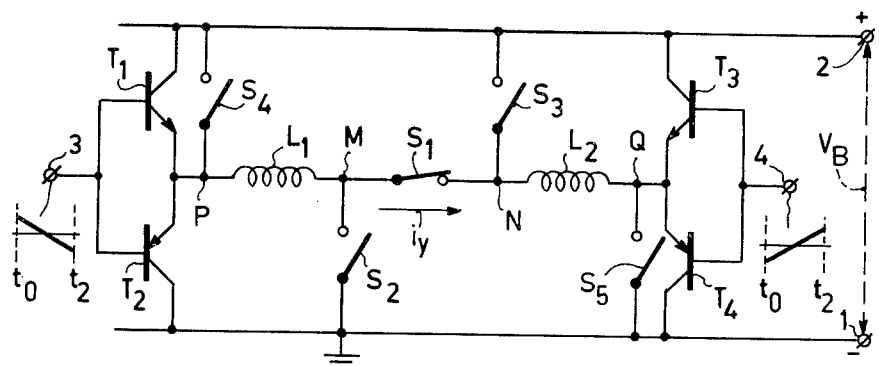

United States Patent [19]

Korver

[11] 3,934,173
[45] Jan. 20, 1976

[54] CIRCUIT ARRANGEMENT FOR GENERATING A DEFLECTION CURRENT THROUGH A COIL FOR VERTICAL DEFLECTION IN A DISPLAY TUBE

[75] Inventor: Jan Abraham Cornelis Korver, Eindhoven, Netherlands

[73] Assignee: U.S. Philips Corporation, New York, N.Y.

[22] Filed: Apr. 3, 1974

[21] Appl. No.: 457,563

[30] Foreign Application Priority Data
Apr. 9, 1973  Netherlands...................... 7304886

[52] U.S. Cl................................. 315/408; 315/399
[51] Int. Cl.²...................... H01J 29/70; H01J 29/76
[58] Field of Search ........... 315/389, 396, 397, 399, 315/407, 408

[56] References Cited
UNITED STATES PATENTS
2,760,109   8/1956   Schade............................... 315/407
3,796,827   4/1974   Riechmann......................... 315/408

*Primary Examiner*—Richard A. Farley
*Assistant Examiner*—T. M. Blum
*Attorney, Agent, or Firm*—Frank R. Trifari; Henry I. Steckler

[57] ABSTRACT

A field deflection output circuit in which the deflector coil is divided in two halves which are connected between the terminals of a direct-voltage source, in series during the trace interval and in parallel in the retrace interval. As a result the retrace interval may be given the correct duration whilst dissipation is kept low so as to enable the circuit arrangement to be integrated in a semiconductor body.

11 Claims, 5 Drawing Figures

CIRCUIT ARRANGEMENT FOR GENERATING A DEFLECTION CURRENT THROUGH A COIL FOR VERTICAL DEFLECTION IN A DISPLAY TUBE

The invention relates to a circuit arrangement for generating a sawtooth deflection current comprising a trace and a retrace through a coil for vertical deflection in a display tube, comprising means for applying control signals to an output amplifier to an output terminal of which the deflector coil may be connected, which coil is divided in two coil halves.

As is known, the repetition rate of the vertical deflection, the field frequency, in a display apparatus is comparatively low, i.e. 50 or 60 Hertz, and the retrace interval of the deflection current is very short compared with the field period, i.e. of the order of one-twentieth thereof. Hence during the trace interval in most field deflector coils the reactive part of the impedance is negligibly small compared with the resistive part, whereas during the retrace interval the converse applies. Thus during the trace interval the voltage across the coil is substantially equal in shape to the current through the coil, i.e. is linear. During the retrace interval this current must rapidly reverse direction. Because during this interval the coil is no longer to be considered as an ohmic resistor but mainly as an inductance, this reversal requires a comparatively high voltage across the coil. When the retrace voltage is not high enough, the retrace interval will be unduly long.

It is possible to use the supply voltage of the output amplifier to provide the said high voltage. However, this has the disadvantage that during the trace interval this voltage is far too high, which involves a large unnecessary dissipation in the output amplifier and requires much power from the voltage supply source. Circuit arrangements are known in which during the retrace interval a voltage is applied which is higher than the supply voltage. This step, however, requires an additional pulse generator including a capacitor having a comparatively large capacitance.

It is an object of the present invention to provide a circuit arrangement having a low dissipation and not requiring such a generator, and for this purpose the circuit arrangement according to the invention is characterized in that it further comprises switching elements by which during the trace interval the coil halves are connected in series with one another and in the retract interval the two coils halves are each connected between the terminals of a direct voltage source.

Because the dissipation in the circuit arrangement is kept low and the supply voltage need not be high, the circuit arrangement may advantageously be integrated in a semiconductor body.

Figure 2:
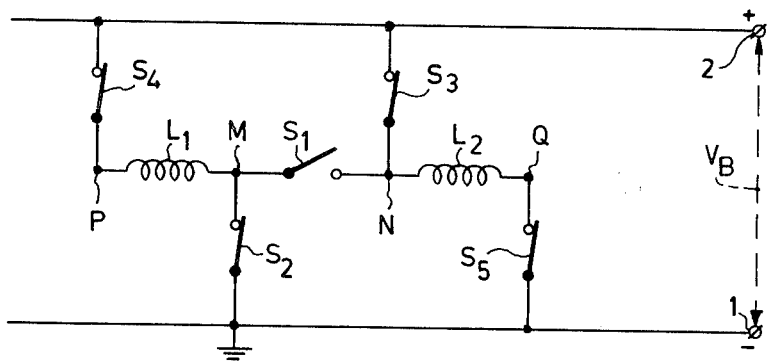
Figure 5:
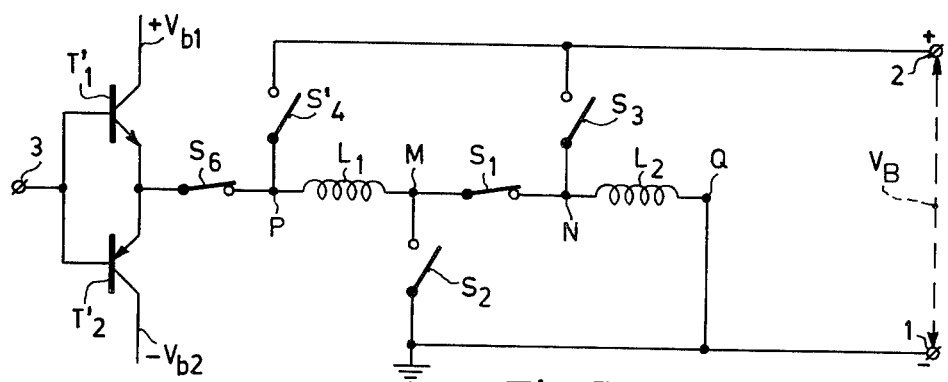
Figure 3:
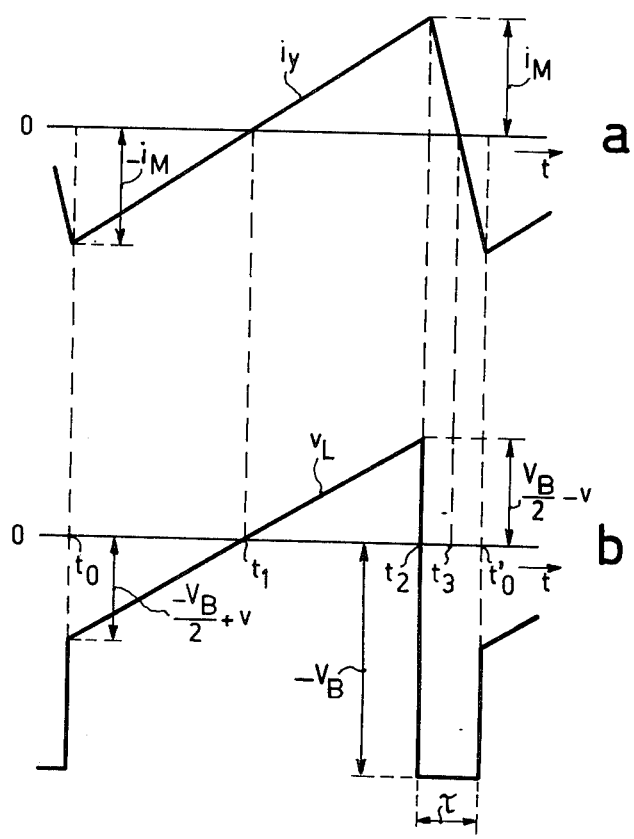
Figure 4:
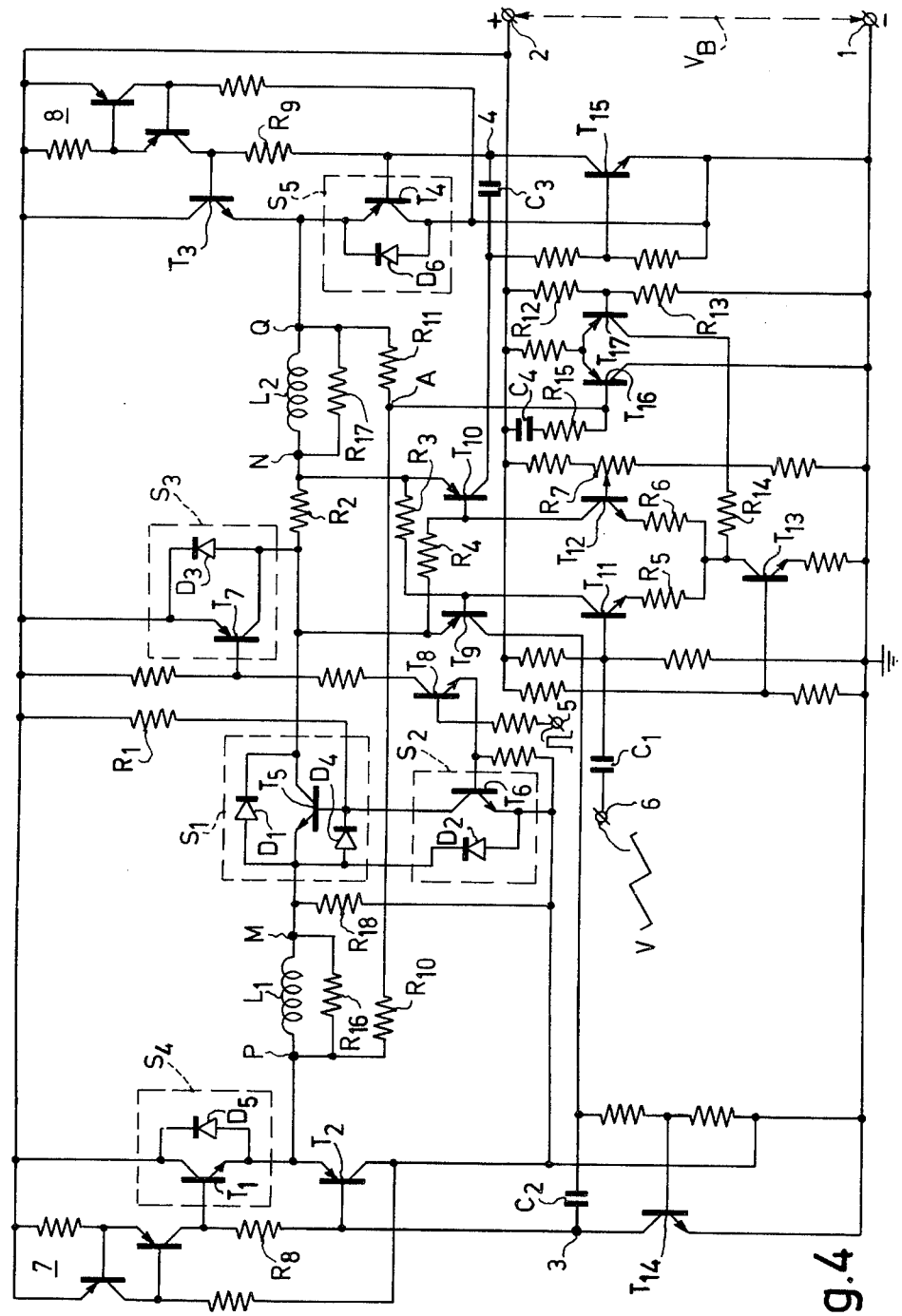

Embodiments of the invention will now be described, by way of example, with reference to the accompanying diagrammatic drawings, in which:

FIG. 1 is a circuit diagram showing schematically the basic elements of an embodiment of the circuit arrangement according to the invention during the trace interval, FIG. 2 is a circuit diagram showing schematically the basic elements of an embodiment of the circuit arrangement according to the invention during the retrace interval, FIG. 3 illustrates the current flowing through, and the voltage set up across, a coil half, FIG. 4 is a schematic circuit diagram of an embodiment of the circuit arrangement according to the invention, and FIG. 5 is a circuit diagram showing schematically the basic elements of the circuit arrangement according to the invention during the trace interval.

Referring now to FIG. 1, a field deflection circuit of a television receiver, not shown further, includes a field deflection coil the two halves $L_1$ and $L_2$ of which, which are assumed to be identical, are connected in series during the trace interval. The emitter of a transistor $T_1$ of the npn type and the emitter of a transistor $T_2$ of the pnp type are connected to one another and to an end P of the coil half $L_1$. The collector of the transistor $T_1$ is connected to the positive terminal 2, and the collector of the transistor $T_2$ is connected to the negative terminal 1, of a voltage supply source. A direct voltage $V_B$ is set up between the said terminals, whilst the terminal 1 may be grounded. The bases of the transistors $T_1$ and $T_2$ are interconnected and form an input terminal 3. An npn transistor $T_3$ and a pnp transistor $T_4$ are connected similarly to the transistors $T_1$ and $T_2$ respectively, the junction point of the interconnected emitters being connected to an end Q of a coil half $L_2$, whilst the interconnected bases form an input terminal 4. Two equal substantially linearly varying control voltages of opposite polarities are applied to the terminals 3 and 4.

The transistors are biassed so as to be non-conductive in the absence of input voltages. In these conditions each pair of transistors $T_1$, $T_2$ and $T_3$, $T_4$ forms a class-B output amplifier. At the instant $t_o$ at which the trace interval begins the control voltage at the terminal 3 is positive relative to the bias voltage at the bases of the transistors $T_1$ and $T_2$, whilst the control voltage at the terminal 4 is negative relative to the bias voltage at the bases of the transistors $T_3$ and $T_4$. Consequently the transistors $T_1$ and $T_4$ conduct whereas the transistors $T_2$ and $T_3$ are cut off. Between the points P and Q a deflection current $i_y$ flows in the direction indicated by an arrow. For simplicity in FIG. 1 the biassing means of the transistors and the means for satisfactory take-over of the currents through the transistors are not shown.

Because during the trace interval the two coils halves $L_1$ and $L_2$ behave substantially as ohmic resistors, the current $i_y$ also is a substantially linearly varying function of time, with a maximum negative intensity $-i_M$ at the instant $t_o$ (see FIG. 3a). For simplicity the so-called S correction and further corrections are neglected. At an instant $t_1$ at about the middle of the trace interval the two input voltages become zero relative to the bias voltages of the transistors and subsequently reverse polarity. Thus the current $i_y$ becomes zero at substantially the same instant $t_1$ and subsequently reverses direction. After the instant $t_1$ the transistors $T_2$ and $T_3$ conduct whilst transistors $T_1$ and $T_4$ are cut off. At the end $t_2$ of the trace interval the control voltages reach their maximum values so that the current $i_y$ assumes its maximum positive intensity $i_M$ at about the same instant, the intensities at the instant $t_o$ and $t_2$ being substantially equal in absolute value.

At the instant $t_o$ the collector emitter voltage of the transistor $T_1$ assumes its minimum value $v$. At the same instant the collector emitter voltage of the transistor $T_4$ also is a minimum. If for simplicity it is assumed that the latter value is equal to $v$ it will be seen that the voltage $v_L$ across each coil half is equal to $-V_B/2 + v$ at the instant $t_o$, the voltage across a coil being termed positive when the voltage relative to ground in FIG. 1 is higher at the right-hand end than at the left-hand end. Similarly the voltage $V_L$ is substantially equal to $V_B/v - v$ at the instant $t_2$. In FIG. 3b the voltage $v_L$ is plotted against time. It will be seen that the voltage at the junction point of the coil halves $L_1$ and $L_2$ is equal to $V_B/2$ during the entire trace interval.

FIG. 2 shows schematically the situation produced according to the invention at the instant $t_2$. A switch $S_1$ is opened between the end M of the coil half $L_1$ and N of the coil half $L_2$ which before the instant $t_2$ have been interconnected. Simultaneously the end M is connected to the terminal 1 via a switch $S_2$ which now is closed, and the end N is connected to the terminal 2 via a switch $S_3$ which now is closed, the end P being connected to the terminal 2 via a switch $S_4$ and the end Q being connected to the terminal 1 via a, switch $S_5$. Each coil half now is connected between the terminals of the voltage source so that the voltage $v_L$ across each coil half has become equal to $-V_B$ (FIG. 3b). After the instant $t_2$ this condition is maintained during a time interval about equal to the time $\tau$ required for the current $i_y$ to pass from the intensity $i_M$ to the intensity $-i_M$. At an instant $t'_o \approx t_2 + \tau$ the switch $S_1$ is closed and the switches $S_2$, $S_3$, $S_4$ and $S_5$ are opened, so that the new situation is the same as that at the instant $t_o$ in FIG. 1. Consequently a new trace interval commences at the instant $t'_o$.

During the retrace interval, in a first approximation the impedance of the deflector coil may be considered to be purely reactive. Assuming the inductance value of each coil half to be L, we have $V_B = L (di_y/dt)$, so that $i_y = -(V_B/L) t + i_M$, where $t = 0$ at the instant $t_2$.

At the instant $t'_o$ we have $t = \tau$ and $-i_M = -(V_B/L) \tau + i_M$, from which $i_M = -(V_B/L) \cdot \tau/2$ and $i_y = -(V_B/L) (t - \tau/2)$.

With this approximation the variation of the current $i_y$ is linear during the retrace interval, the current $i_y$ becoming zero at an instant $t_3$ (FIG. 3a) at the middle of the retrace interval and then reversing direction. From the above it is found that the duration $\tau$ of the retrace interval is inversely proportional to the voltage $V_B$ and hence can be determined by this value with given values of L and $i_M$. If the coil halves had remained in series, the retrace interval would have been longer. Because in actual fact during the retrace interval the current $i_y$ does not vary linearly but varies exponentially, the retrace interval would be more than doubled and hence could be inadmissibly long.

FIG. 4 shows a practical embodiment of the circuit arrangement according to the invention, elements corresponding to those of FIGS. 1 and 2 being designated by the same reference symbols. Because the current which flows through the switches of FIG. 2 in the closed condition thereof must be capable of reversing direction at the instant $t_1$, the switches take the form of bipolar switches, in the embodiment shown as the inverse parallel arrangement of a transistor and a diode. The term "inversely parallel" is used herein to mean that one electrode of the diode is connected to the collector of the transistor and the other electrode of the diode is connected to the emitter of the transistor, the pass direction of the diode being opposite to that of the collector current of the transistor. Thus the switch $S_1$ comprises a transistor $T_5$ and a diode $D_1$, the switch $S_2$ a transistor $T_6$ and a diode $D_2$, and the swtich $S_3$ a transistor $T_7$ and a diode $D_3$.

Positive-going pulses at the field repetition frequency with a duration about equal to $\tau$ are applied to a terminal 5. These pulses may be produced, for example, by a negative-feedback circuit to be described hereinafter. Via a transistor $T_8$ pulses of suitable polarity are applied to the transistors $T_5$, $T_6$ and $T_7$, with the result that in the retrace interval the transistors $T_6$ and $T_7$ are highly conductive whilst the transistor $T_5$ is cut off. A diode $D_4$ ensures that the base emitter voltage of the transistor $T_5$ does not become more negative than is permissible. In contradistinction thereto, during the trace interval the transistor $T_5$ is in the saturation condition owing to a base resistor $R_1$ being connected to the terminal 2, whilst the transistor $T_6$ and $T_7$ are cut off and the diodes $D_2$ and $D_3$ cannot pass current because the voltage at their cathodes is higher than that at their anodes. During the time interval $t_o$ to $t_1$ the current $i_y$ flows through the diode $D_1$, and during the interval $t_1$ to $t_2$ this current flows through the transistor $T_5$.

As will be set out more fully hereinafter, the switch $S_4$ comprises the transistor $T_1$, which forms part of the output amplifier $T_1$ and $T_2$, and a diode $D_5$ connected the inverse parallel with the transistor. Similarly the switch $S_5$ comprises the transistor $T_4$, which forms part of the output amplifier $T_3$ and $T_4$, and a diode $D_6$ connected in inverse parallel with the transistor. In the retrace interval the transistors $T_1$ and $T_4$ are saturated. During the time interval $t_2$ to $t_3$ the current through the coil half $L_1$ flows through the diodes $D_2$ and $D_5$, and the current through the coil half $L_2$ flows through the diodes $D_6$ and $D_3$. During the time interval $t_3$ to $t'_o$ the former current flows through the transistor $T_1$ and $T_6$ whilst the latter current flows through the transistors $T_7$ and $T_4$.

A measuring resistor $R_2$ of small value (about 0.5 $\Omega$) is connected between the switch $S_1$ and the end N of the coil half $L_2$. The voltage across this resistor is a measure of the deflection current. The emitters of two pnp transistors $T_9$ and $T_{10}$ are connected each to an end of the resistor $R_2$, whilst a resistor $R_3$ and a resistor $R_4$, both of about 1 k $\Omega$, are connected between the emitter of the transistor $T_{10}$ and the base of the transistor $T_9$ and between the emitter of the transistor $T_9$ and the base of the transistor $T_{10}$, respectively. The collector of an npn transistor $T_{11}$ is connected to the base of the transistor $T_9$ and the collector of an npn transistor $T_{12}$ is connected to the base of the transistor $T_{10}$. The emitters of the transistors $T_{11}$ and $T_{12}$ are interconnected via two resistors $R_5$ and $R_6$ of about 560 $\Omega$ each, the junction point of the said resistors being connected to the collector of a transistor $T_{13}$ which acts as a supply of constant current.

The base of the transistor $T_{11}$ is connected via a capacitor $C_1$ to a terminal 6 to which a field-frequency sawtooth-shaped input voltage V is applied, which during the trace interval has the same polarity as the voltage $v_L$ of FIG. 3b and has a peak value of about 1 volt. The collector current of the transistor $T_{11}$ has the same polarity as the voltage V, whilst that of the transistor $T_{12}$ has opposite polarity. The bias direct voltage at the base of the transistor $T_{11}$ is constant, but that at the base of the transistor $T_{12}$ may be adjusted so that in the absence of the voltage V the said collector currents are equal. Thus the transistors $T_{11}$ and $T_{12}$ constitute a differential amplifier.

The collector currents of the transistors $T_9$ and $T_{10}$ control the bases of a control transistor $T_{14}$ and of a control transistor $T_{15}$ respectively the collectors of which are directly connected to the bases of transistors $T_2$ and $T_4$ respectively and via small take-over resistors $R_8$ and $R_9$ of, for example, 33 $\Omega$ to the bases of transistors $T_1$ and $T_3$ respectively. Thus the collectors of the transistors $T_{14}$ and $T_{15}$ are the points 3 and 4 respectively of FIG. 1. Furthermore constant-current sources 7 and 8 are connected between the terminal 2 and the bases of the transistors $T_1$ and $T_3$ respectively.

During the trace interval the circuit arrangement described operates as follows. When the voltage V increases, the base voltage of the transistor $T_9$ falls whilst that of the transistor $T_{10}$ rises. Consequently the base voltage of the transistor $T_{14}$ increases and that of the transistor $T_{15}$ decreases. As a result the voltage at the point P and hence that at the point M decrease, whereas the voltage at the point Q and hence that at the point N increase. This results in a decrease of the emitter voltage of the transistor $T_9$ and an increase of the emitter voltage of the transistor $T_{10}$. Thus the circuit arrangement described provides negative feedback, attempting to maintain the base emitter voltages of the transistors $T_9$ and $T_{10}$ constant. The resistance value of the measuring resistor $R_2$ is selected so that the maximum voltage drop across this resistor, which is about 0.4 volt at $i_M = 0.8$ A, is lower than the said voltage, whilst the power dissipated by it is low compared with the power dissipated by the coil halves $L_1$ and $L_2$ which each have an ohmic resistance of about 12 to 15 $\Omega$. The negative-feedback circuit ensures that the deflection current varies substantially in the same manner as the input voltage V. Also, no linearity error is produced which might be due to the fact that the voltage drop across the transistor $T_5$ differs from the across the diode $D_1$.

At the instant $t_2$ the voltage V rapidly decreases so that the base voltage of the transistor $T_{14}$ abruptly decreases and that of the transistor $T_{15}$ abruptly increases. Because in the case of rapid variations the coil halves $L_1$ and $L_2$ have a predominantly reactive impedance, the deflection current cannot follow these variations. Under these conditions the transistor 14 is cut off and the transistor $T_{15}$ becomes saturated. The current generated by the current source 7 entirely flows to the base of the transistor $T_1$ which just before the insant $t_2$ was cut off and now is saturated. Similarly the transistor $T_4$, which also was cut off just before the instant $t_2$, is saturated. The transistors $T_2$ and $T_3$ are conducting before the instant $t_2$ and are cut off after it. Thus, the potential at the point P becomes substantially equal to that of the supply source, whereas that at the point Q becomes about zero. The voltage $V_B$ is approximately set up across the series combination of the coil halves so that the negative-feedback circuit also ensures the retrace. From the discussion of FIG. 2 it has been found, however, that the retrace interval will be longer than the desired duration $\tau$.

Approximately at the instant $t_2$, however, according to the invention the ascending edge of the pulse at the terminal 5 occurs, with the result that, as stated hereinbefore, the voltage set up across each coil half is not $V_B/2$ but $V_B$, so that the retrace interval will have the desired shorter duration $\tau$. From the foregoing it will be clear that the transistors $T_1$ and $T_4$, which during the trace interval from part of class-B amplifiers, i.e linear amplifiers, in the retrace interval form part of bipolar switches, namely the switches $S_4$ and $S_5$ of FIG. 2. Thus they each have a dual function. Obviously the invention may also be carried out with the use of separate switches $S_4$ and $S_5$. The invention may also be carried out with the use of output amplifiers of another type than class B. It should be noted that the supply voltage for the amplifiers need not necessarily be the voltage applied to the coil halves during the retrace interval. As a further alternative a single output amplifier may be used. FIG. 5 shows such a design during the trace interval, two transistors $T'_1$ and $T'_2$ constituting the output amplifier which is fed with two supply voltages $+V_{b_1}$ and $-V_{b_2}$. The coil and Q now is grounded, possibly via a measuring resistor, whilst the end of P is connected to the output amplifier $T'_1$, $T'_2$ by means of switch $S_6$ during the trace interval and to the terminal 2 by means of a switch $S'_4$ during the retrace interval. The embodiment illustrated in FIGS. 1, 2 and 4 has the advantage that a single direct-voltage source is sufficient.

In the embodiment shown in FIG. 4 the negative-feedback circuit ensures stabilization of the current $i_y$ and the voltage $v_L$. Further stabilization is obtained by ensuring that the electrical midpoint of the resistor $R_2$ is maintained at the potential $V_B/2$ during the entire trace interval. For this purpose two resistors $R_{10}$ and $R_{11}$ of substantially equal values (about 5.6 k $\Omega$) are connected in series between the points P and Q. The junction A of these resistors is connected to the base of a transistor $T_{16}$ which together with a transistor $T_{17}$ constitutes a differential amplifier. The base of the transistor $T_{17}$ is biassed by the voltage $V_B/2$ by means of two equal resistors $R_{12}$ and $R_{13}$ of about 10 k $\Omega$ and its collector is connected to that of the transistor $T_{13}$ via a resistor $R_{14}$ of, for example, 1 k $\Omega$. When for any reason the voltage at the point A differs from the value $V_B/2$, the collector currents of the transistors $T_{11}$ and $T_{12}$ vary with respect to the nominal situation so that the balanced condition in which the voltage at A had the correct value is rapidly restored. During the retrace interval this circuit arrangement is not subject to change, because the voltage at the point A must still be equal to $V_B/2$.

The circuit arrangement of FIG. 4 further includes the following details: a capacitor $C_2$ of about 100 pF is connected between the collector of the transistors $T_9$ and $T_{14}$, a similar capacitor $C_3$ is connected between the collectors of the transistors $T_{10}$ and $T_{15}$, and the series combination of a resistor $R_{15}$ of about 150 $\Omega$ and a capacitor $C_4$ about 100 nF is connected between the point A and the terminal 2, for the purpose of preventing oscillation; the coil halves $L_1$ and $L_2$ are each shunted by a resistor $R_{16}$ and $R_{17}$ respectively of about 220 $\Omega$ which serve to short-circuit line-frequency voltages produced by the line-deflection coil and induced via the core of the deflection unit; a resistor $R_{18}$ of about the same value as the resistor $R_1$ (about 470 $\Omega$) is connected between the point M and the terminal 1 to remove the asymmetry introduced by the resistor $R_1$.

It should be noted that the dissipation in the circuit arrangement according to the invention, except for that due to the coil halves, is comparatively low, for in FIG. 4 only the transistors $T_1$, $T_2$, $T_3$, $T_4$, $T_5$, $T_6$ and $T_7$ pass heavy currents and/or have to withstand high voltages, whilst the remaining elements of the circuit arrangement handle small signals. During the trace interval, only the transistors $T_1$ and $T_4$ conduct between the instants $t_0$ and $t_1$ and only the transistors $T_2$ and $T_3$ conduct between the instants $t_1$ and $t_2$, the supply voltage not being increased owing to the step according to the invention, whilst the transistor $T_5$ is saturated and hence causes substantially no dissipation, and the transistors $T_6$ and $T_7$ are cut off. During the retrace interval the dissipation is substantially zero, because the transistors $T_1$, $T_4$, $T_6$ and $T_7$ are saturated and the transistors $T_2$, $T_3$ and $T_5$ are cut off. Owing to this low dissipation the circuit arrangement, except for the capacitors and the coil halves, may advantageously be integrated in a semiconductor body. This is posssible also because the supply voltage, in the embodiment of FIG. 4 about 25 volts, may be low. To render the circuit arrangement adapted to be integrated it must be slightly modified in known manner. For example, the transistors $T_2$ and $T_4$ must be replaced by npn transistors.

What is claimed is:

1. Circuit arrangement for generating a sawtooth-shaped deflection current comprising a trace interval and a retrace interval through a coil for vertical deflection in a display tube, comprising means for applying control signals to an output amplifier having output terminal, means for coupling the deflection coil to the output terminal, which coil is divided in two coil halves, characterized in that the circuit arrangement further comprises switching elements by which during the trace interval the coil halves are connected in series with one another and in the retrace interval the two coil halves are each connected between the terminals of a direct-voltage source.

2. Circuit arrangement as claimed in claim 1, characterized in that there is connected between the second end of the first coil half, which end is not connected to the output terminal of the output amplifier, and a first end of the second coil half a first switch which conducts during the trace interval, in that between this second end of the first coil half and a first terminal of the direct-voltage source there is connected a second switch which conducts in the retrace interval, and in that between the first end of the second coil half and the second terminal of the direct-voltage source there is connected a third switch which conducts in the retrace interval, whilst in the retract interval the first end of the first coil half is connected to the second terminal of the direct-voltage source and the second end of the second coil half is connected to the first terminal of the direct-voltage source.

3. Circuit arrangement as claimed in claim 2 in which the output amplifier comprises two amplifying elements which are connected in series, their junction point constituting the output terminal, characterized in that the connection established between a coil half and a terminal of the direct-voltage source in the retrace interval includes an amplifier element.

4. Circuit arrangement as claimed in claim 3 in which the switching elements are transistors, characterized in that control means are provided for driving a transistor into saturation in the retrace interval, a diode being connected in inverse parallel with the said transistor.

5. Circuit arrangement as claimed in claim 4 in which a control signal is applied to the transistors via a control transistor, characterized in that the collector load of the control transistor is a source of substantially constant current.

6. Circuit arrangement as claimed in claim 2, characterized in that the switches are bidirectionally conductive.

7. Circuit arrangment as claimed in claim 6, characterized in that each swtich comprises the inverse parallel connection of a transistor and a diode, control means being provided for driving the transistor into saturation.

8. Circuit arrangement as claimed in claim 1 further comprising a negative-feedback circuit including a differential amplifier, characterized in that two resistors are connected in series between the first end of the first coil half and the second end of the second coil half, the junction point of these resistors being connected to an input of a comparison stage for comparing the voltage at the said point to a constant voltage, whilst an output of the comparison stage influences the differential amplifier.

9. Circuit arrangement as claimed in claim 8, characterized in that at least the amplifying elements, the switches, the control means, the negative-feedback circuit and the comparison stage are integrated in a semiconductor body.

10. circuit arrangement as claimed in claim 1 characterized in that the direct-voltage source is the voltage supply source of the output amplifier.

11. A circuit for generating from a direct voltage source a sawtoothed shaped current having trace and retrace intervals through a coil having two halves, said circuit comprising an amplifier having an input means for receiving control signals and an output terminal, means for coupling said coil to said terminal, and switching means for coupling said coil halves in series with one another during said trace interval and for coupling each of said coil halves to said direct voltage source during said retrace interval.

* * * * *

UNITED STATES PATENT AND TRADEMARK OFFICE
CERTIFICATE OF CORRECTION

PATENT NO. : 3,934,173
DATED : January 20, 1976
INVENTOR(S) : JAN ABRAHAM CORNELIS KORVER It is certified that error appears in the above-identified patent and that said Letters Patent are hereby corrected as shown below:

IN THE CLAIMS

Claim 2, col. 7, line 40, cancel "retract" and insert -- retrace --;

Signed and Sealed this

Thirteenth Day of July 1976

[SEAL]

Attest:

RUTH C. MASON
Attesting Officer

C. MARSHALL DANN
Commissioner of Patents and Trademarks